United States Patent [19]

Tagami

[11] 4,315,252

[45] Feb. 9, 1982

[54] APPARATUS FOR DETECTING THE RELATIVE POSITION OF TWO MOVABLE BODIES

[75] Inventor: Ichizo Tagami, Hachioji, Japan

[73] Assignee: Ishikawajima-Harima Jukogyo Kabushiki Kaisha, Tokyo, Japan

[21] Appl. No.: 105,646

[22] Filed: Dec. 20, 1979

Related U.S. Application Data

[63] Continuation-in-part of Ser. No. 826,666, Aug. 22, 1977.

[30] Foreign Application Priority Data

Aug. 23, 1976 [JP] Japan ............................ 51/100367

[51] Int. Cl.³ ...................... H03K 13/02; H03K 13/18
[52] U.S. Cl. ........................ 340/347 P; 250/231 SE; 340/347 M
[58] Field of Search ............... 340/347 M, 347 P; 250/231 SE

[56] References Cited

U.S. PATENT DOCUMENTS

| 1,942,106 | 1/1934 | Kottman | 235/61 PH X |
| 3,165,731 | 1/1965 | Spaulding | 340/347 P |
| 3,594,764 | 7/1971 | Walsh | 340/347 P |
| 3,845,290 | 10/1974 | Reitsma | 340/347 DD X |
| 3,862,407 | 1/1975 | Baldauf et al. | 340/347 DD X |

Primary Examiner—Thomas J. Sloyan
Attorney, Agent, or Firm—Scrivener, Clarke, Scrivener and Johnson

[57] ABSTRACT

Apparatus is disclosed for detecting the relative position or displacement between two movable bodies, wherein a reader or sensor mounted on one of the two bodies reads a code pattern on the other body. A code pattern is provided that represents a binary-coded base-n number, each digit of a base-n number being represented by each of first, second, third, . . . , and m-th unit-distance codes (where m being the least submultiple except 1 of the base-n number system), these codes in turn being converted into a common binary code so that the relative position or displacement between the two bodies may be represented by the binary-coded base-n number.

2 Claims, 25 Drawing Figures

APPARATUS FOR DETECTING THE RELATIVE POSITION OF TWO MOVABLE BODIES

This application is a continuation-in-part of application Ser. No. 826,666, filed Aug. 22, 1977.

BRIEF DESCRIPTION OF THE PRIOR ART

It is known in the prior art (as shown schematically in FIG. 1 of the accompanying drawing) to provide an encoder for measuring the relative movement between a pair of bodies X and Y, one side face of the body X being marked with binary codes Z in the direction of movement. A reader or sensor W mounted on the body Y reads the binary code Z on the body X in opposed relationship with the reader W so that the relative position between the bodies X and Y may be detected. More particularly, the bodies X and Y are coupled through suitable connecting means i and ii to bodies X' and Y', respectively, in order to detect the relative position or displacement between the bodies X' and Y'. That is, the relative position or displacement between the bodies X' and Y' is measured in terms of the relative position or displacement between the bodies X and Y.

Figure 1:
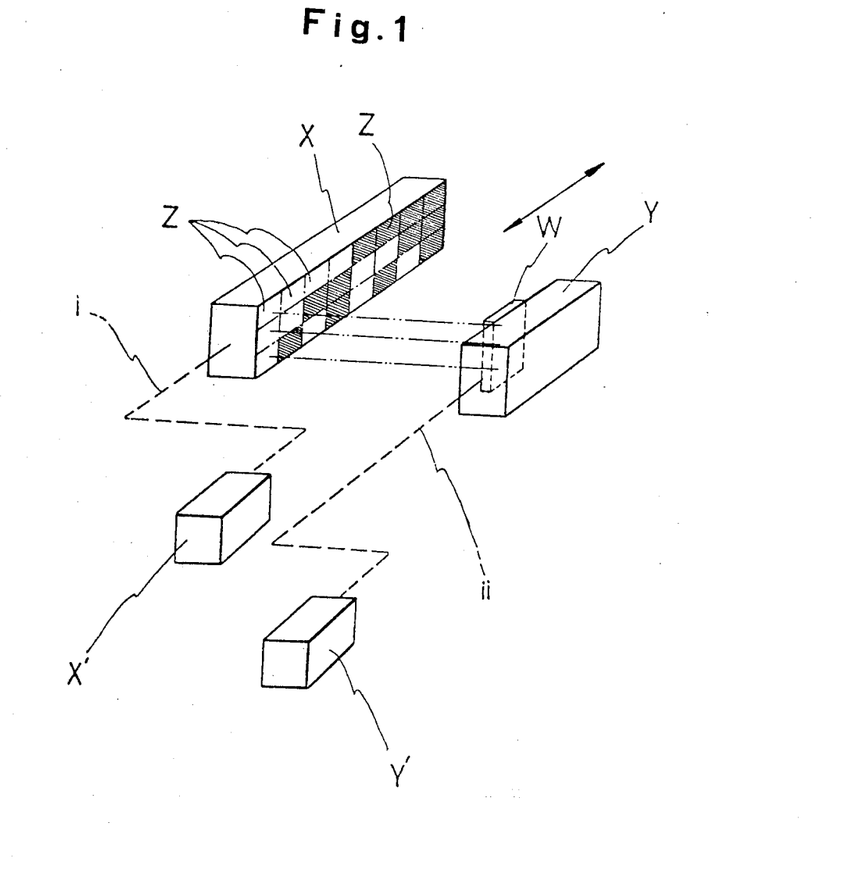
FIG. 1 is a schematic view used for the explanation of an encoder.

In practice, the body X consists of an elongated coding mask or coding disk, and the binary one "1" and zero "0" of the binary codes Z are represented by the respective presence and absence of holes, by respective light transmitting and non-transmitting areas, by respective electrically conductive and nonconductive areas, by respective magnetized and nonmagnetized areas and so on. The reader W may be a photoelectric reader, brushes, microswitches, magnetic heads or the like. The body Y serves to support the reader W.

Figure 2A:
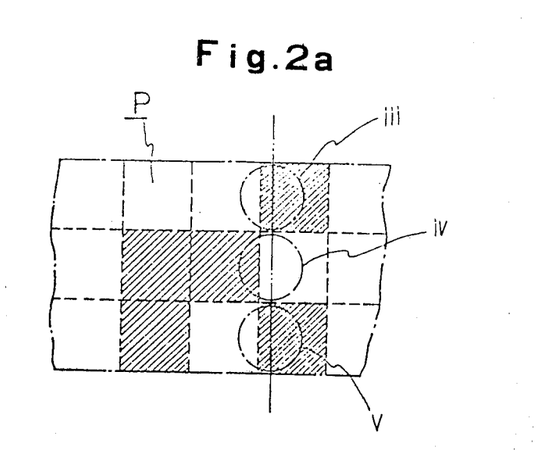
FIGS. 2a and 2b are views used for the explanation of the generation of the erroneous outputs in the encoder shown in FIG. 1.
Figures 2A, 7:
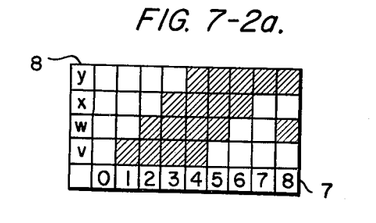
Figures 2A, 8:
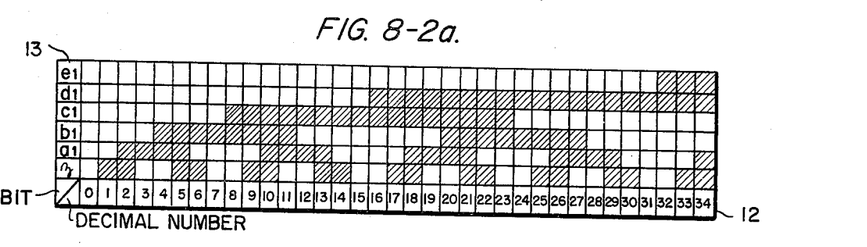
Figure 2B:
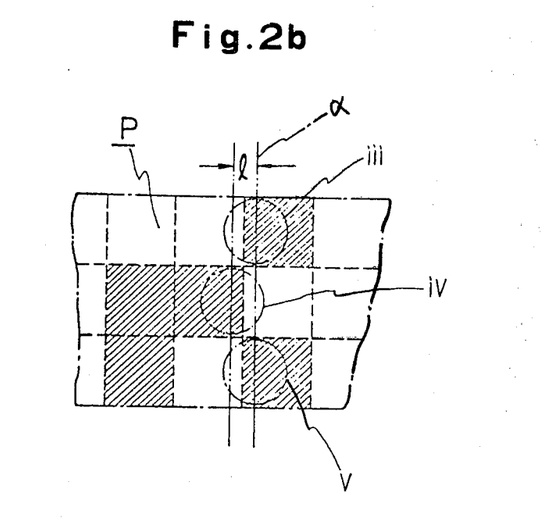
Figures 2B, 7:
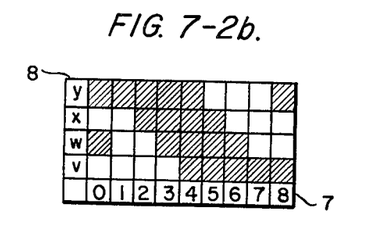
Figures 2B, 8:
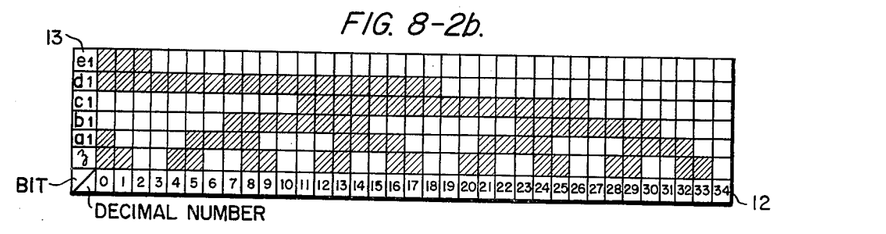
Figures 2C, 7:
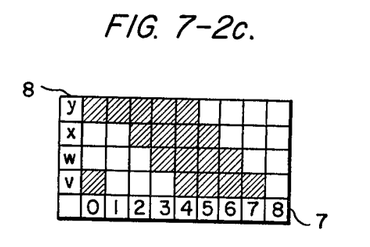
Figures 2C, 8:
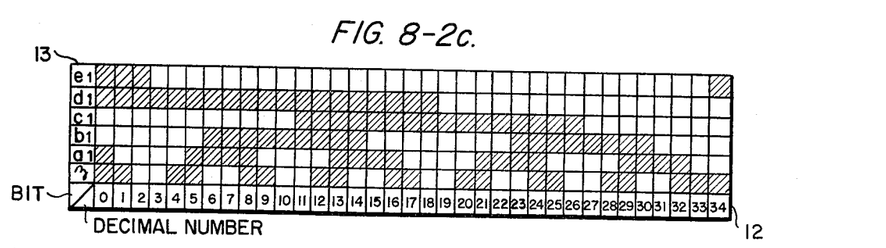
Figures 2D, 8:
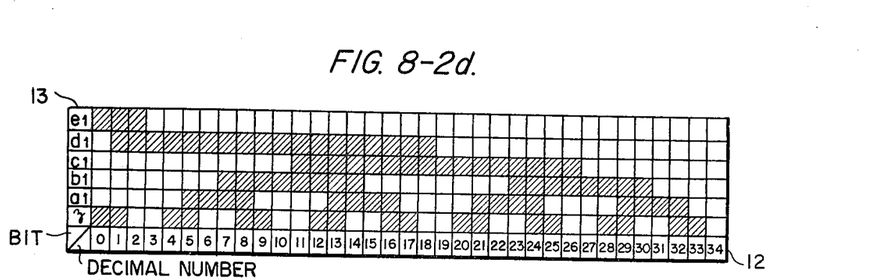

However, the encoder has certain inherent drawbacks owing to its fundamental construction, as will be described in detail with reference to FIGS. 2a and 2b. In FIG. 2b, coding mask or plate P is marked with three-bit characters "110", "010" and "101", a hatched square representing the binary "1", while a white square, the binary zero "0". A reader is provided with three reader heads iii, iv and v so that the binary coded marks on the coding mask P may be scanned from the left to the right. With the three reader heads iii, iv and v correctly vertically aligned, the characters "110", "010" and "101" are correctly read out in the order named as shown in FIG. 2a. However, when the reader head iv is misaligned with the upper and lower heads iii and v by a distance λ as shown in FIG. 2b, the distance being the horizontal distance between the vertical line α passing both the centers of the reader heads iii and v, the outputs would be "110", "010", "111" and "101". That is, an erroneous output "111" is generated between "010" and "101". If a digital computer connected to the reader is so programmed as to deliver an instruction in response to the output "111", a serious accident would result.

This erratic function is inherent to any encoders regardless of their types such as brush type, optical type, magnetic type and so on. When the width of the binary codes is reduced in order to increase the resolution in position detection, even a very small misalignment between the reader heads will result in frequent erroneous outputs.

PRIOR ART EXAMPLE 1

Figure 3:
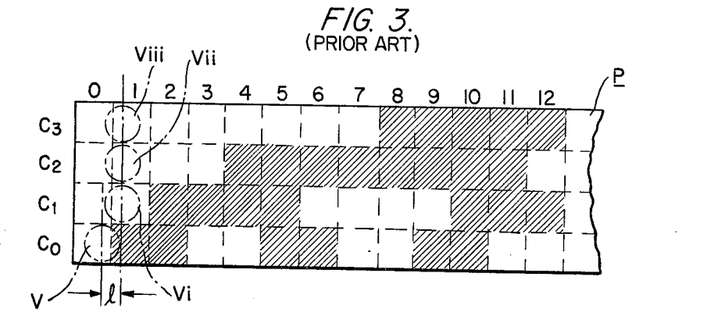
FIG. 3 shows a coding mask or plate marked with a Gray code pattern.

In order to avoid the erratic operation or erroneous outputs, there has been devised and demonstrated a binary code pattern as shown in FIG. 3. The coding mask is marked with four-bits words, a hatched square representing the binary one "1" while a white square, the binary zero "0", the least significant, next least significant, next most significant and most significant bits being indicated by $C_0$, $C_1$, $C_2$ and $C_3$, respectively. Decimal numerals "0", "1", "2", "3" and so on are represented by the words appearing in respective columns. This is one of a number of unit-distance code patterns for consecutive numbers, whose bit states of immediately neighboring words are the same in every place except one, and at the transient place of a word only one bit changes its state. For instance, compare the word representing the decimal number "0" with the binary number equivalent to the decimal number "1". They are different in that the bit states are different only in the least significant bit $C_0$. In like manner the words representing the decimal numbers "9" and "10" or the addresses "9" and "10" are different in that the bit states in $C_1$ are different by one bit. This coding pattern is called Gray code and is advantageous in that the Gray code may be easily converted into the common binary code.

With the Gray code shown in FIG. 3, no erroneous output will be generated even when one of the reader heads, for instance the reader head v is misaligned from other reader heads vi, vii and viii by λ as shown in FIG. 3. Thus when the addresses 0, 1, 2, 3 and so on are represented by Gray code or a unit distance code, they may be correctly detected.

PRIOR ART EXAMPLE 2

The digital coding and translating system of Spaulding U.S. Pat. No. 3,165,731 is characterized by indicating the Arabic decimal number represented by a set of physical code elements comprising a plurality of groups corresponding to the respective digits of the Arabic number, the configuration of the code element states of each group representing the value of the corresponding Arabic digit in accordance with one syncopic code when the preceding Arabic digit has one parity, and representing that digit value in accordance with another syncopic code when the preceding Arabic digit has the other parity. For instance, in order to convert any Arabic decimal number to the corresponding representation in code I (Col. 5), starting with the most significant Arabic digit and progressing to the right, each Arabic digit that is preceded by an even digit is copied directly; each Arabic digit that is preceded by an odd digit is replaced by its 9's complement. In code I binary code elements or bits are used to represent a syncopic binary code such that the binary code representation of any Arabic digit value for one preceding parity is transformable into the binary representation of that digit value for the other preceding parity merely by inverting the state of a particular one of the binary code elements.

Spaulding explains his system in conjunction with the decimal numbers; that is, an even-number radix notation, but not with reference to an odd-number radix notation.

To use Spaulding's system to represent various numerals would have some problems as described below.

When the counting is started from "0" to a maximum number or value such as "999", "799", "599", "399" or "199"; that is, the number wherein the most significant digit is odd and the remaining digits are all "9"s, it is possible to transform a binary code representing that particular maximum value into a binary code representative of "0" merely by inverting the state of a particular one of the binary code elements by the use of Excess Code Technique. However, it is to be emphasized that it is impossible to do so when a maximum value is "899" or "359".

In other words, Spaulding explains his system with reference only to consecutive numbers but does not mention at all about the relationships between a maximum value, a minimum value and odd numbers.

In this connection, the relationship between a maximum value and a minimum value will be described in detail with particular reference to FIG. 3 in the drawings of the present application.

(a) Each group contains a number of n characters whose bit states of immediately neighbouring words are the same in every place except one and the transient place of the words no bit changes its state except one. When the character "0" has an even number of "1" bits (which are represented by hatched squares) and which is zero in this case, the even number characters "0", "2", "4", "6" and so on have an even number of "1" bits while the odd-number characters such as "1", "3", "5" and so on have an odd number of "1" bits. That is, even and odd numbers of "1" bits alternate.

The characters "1", "3" and "7" are different from the character "0" only in one place of bit. With Excess Code technique and so on, the characters "5", "9" and "11" may be transformed in such a way that they are also different from the character "0" only in one place. Thus, all the odd numbers may be such that they are different from the character "0" only in one place.

(b) A predetermined group of binary codes is used to denote the most significant digit of a decimal number. Consequently, in order to form a link of unit-distance codes by directly linking the binary code representing "0" in said predetermined group with a maximum character the maximum number must be odd. When the maximum number is even, the adjacent codes are different in more than two places because the binary codes with the same bit state cannot be used within the same group.

(c) As a result, when one compares with the character "0" with a maximum number, he will find that they are different from each other in one or more bits in the highest or most significant digit.

(d) In order to denote the digits other than the most significant digit, a chain consisting of one or more cycles, each cycle of which consists of two types of binary codes, is used. In this chain, the first and the last characters are the same in the bit state.

(e) Therefore it follows that if the characters which denote a maximum value or word (consisting of a plurality of digits) are represented, respectively, by the last characters of the cycle, they may be a unit-distance code wherein "0" and "a maximum" value may be directly linked or positioned adjacent to each other. In other words, the sufficient conditions are that the highest order or the most significant digit is odd and that the remaining orders or digits are all round numbers or full numbers. Unless these conditions are satisfied extremely complicated coding procedures would be required.

(f) Because of the same reasons described above, the representation of an odd number by a complete unit-distance code will be impossible by applying a cycle of two types of codes because breaking a cycle by halves would be required for connection at every carrying up position of the immediate upper digit.

(g) Spaulding's invention is concerned with the provision of syncopic digital codes that are particularly useful for transforming data from analogue form into the form of a syncopic digital code using for instance 9's complements. On the other hand, the present invention contemplates the countermeasures against various problems which arise when a plurality of groups of binary codes are chained into a cyclic code. Both inventions are common in that the unit-distance codes are used. However, it is to be emphasized that Spaulding explains his system with reference to only two types of unit-distance codes, while the present invention was made to solve the problems in coding which cannot be solved by the use of only two types of binary unit-distance codes.

PRIOR ART EXAMPLE 3

The Walsh U.S. Pat. No. 3,594,764 relates to a device which may predict the occurrence of an ambiguous code curing transition, thereby duly processing the code.

In general, a strobe is used to read the output from an encoder which tends to generate ambiguous codes.

Figure 4:
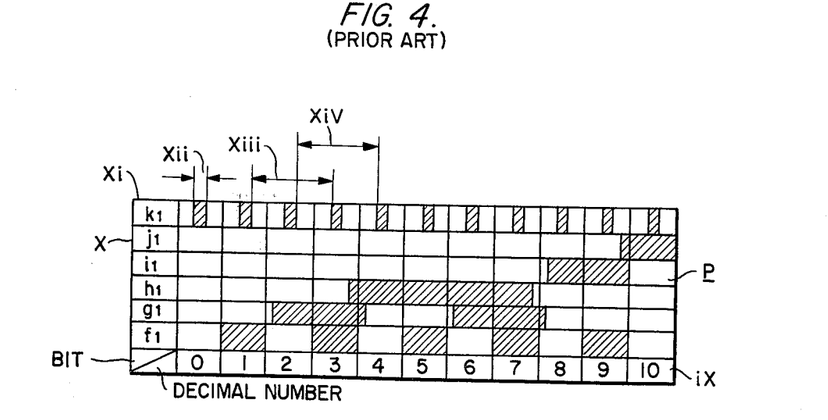
FIG. 4 is used for the explanation of a conventional strobe signal system.

In FIG. 4, decimal number 0–10 ix are represented by five bits x in the pattern P with the one strobe bit xi, as shown. However the rising and falling edges of the "1" bit in one digit position do not coincide exactly with those of the "0" and "1" bits in other digit positions so that the erratic reading would result unless the strobe bits are inserted. That is, the time for reading the bit pattern P is limited only to the pulse width xii of the strobe bit xi. The code or bit pattern P which is read out in this manner is transferred into a memory and latched.

The strobe bits xi described above are different in both properties and function from the sync bit of the present invention, particularly that in (a) the transition of the bit pattern is avoided during the presence xii of the strobe bit xi, while during the absence of the strobe bit the transition is permitted and the bit pattern becomes ambiguous; (b) that the strobe bit xi is used to control the reading and does not represent any data such as a decimal number defined by bits x; and (c) that since the bit pattern or code P which as been read out is latched until the next strobe bit xi appears (for instance, the bit pattern representative of the decimal number "2" is scanned over a time period xiii and the bit pattern representative of the decimal number "3" is scanned over a period xiv), the hysteresis of the detected bit patterns become larger.

On the other hand, the sync bit, as will be described below with reference to FIG. 9, is used instead of the data signals. When the sync bit is generated, the encoder generates ambiguous codes, but when no sync bit is generated, no ambiguous code is generated. Furthermore data represented by the binary codes including sync bit have no hysteresis at all.

PRIOR ART EXAMPLE 4

The Kottmann U.S. Pat. No. 1,942,106 relates to a total printing device for the automatic transferring of numerical values from the stationary counter mechanism of a calculating machine to a sheet arranged in a typewriter and is more concerned with the "Lock" signals for suppressing the zero printing and shifting. It is also apparent that this patent is quite irrelevant to the present invention which contemplates the erratic reading of binary codes.

As recited in the claims of Kottmann, "each of said levers is journaled on a second angle lever which is so shifted by means of the corresponding rack as soon as the corresponding number wheel leaves the zero position that the angle lever journalled thereto becomes inoperative." That is, the second angle lever is locked to avoid the zero printing, but is released for printing other Alphanumerics.

Figure 5:
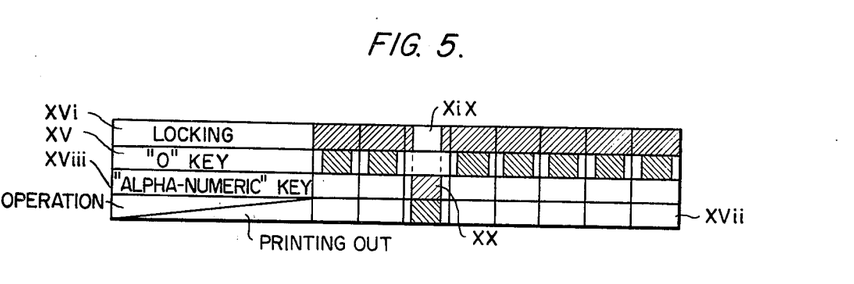
FIG. 5 is used for the explanation of a locking signal in response to which the printing of "0" by a typewriter may be suppressed or masked.

In FIG. 5, "locking" is described. For instance, when the decimal number "0" key xv of a typewriter is depressed, locking signal xvi appears so that the printing out xvii of "0" is suppressed. However when other keys xviii are depressed, no locking signal xvi appears as indicated at synchronism xix.

Locking of the typewriter described is well known in the art and may be realized mechanically or electrically using digital circuits and monostable multivibrators.

However, the appearance and disappearance of the locking signal xvi is similar to the operation of slave means in that the locking signal xvi appears or disappears in synchronism xix with or a predetermined time after the transition of alphanumeric key xviii as viewed from the relationship between xix and xx. As a result, when key operation which represents neither "0" xv nor "any other alphanumerics" xviii, the locking signal xvi becomes ambiguous.

The locking signal xvi is obtained only after the detection of the depression of the alphanumeric key xviii. In other words, the locking depends on the alphanumeric key xviii.

However, the locking xvi is completely different from the sync bit code in accordance with the present invention. That is, the sync bit code is inherent to code generating means. It functions spontaneously eliminating other codes, and occupies the unique regions including the transitions between other codes. In other words, it has its own unique functions quite independent of those of other data. Since other data vary in an ambiguous manner, the sync bit code is assigned to the positions which is not interferred by other data or codes.

SUMMARY OF THE INVENTION

The present invention relates to apparatus including an encoder for detecting the relative position of two movable bodies, which system converts an analogue quantity of displacement into a digital code.

The system is operable to code numbers in odd-number radix and to sync bits, characterized in that more than three types of codes and the discrimination signal from the next higher significant digit are fed into each of converter circuits except one for converting the most significant digit.

BRIEF DESCRIPTION OF THE DRAWINGS

Other objects and advantages of the invention will become apparent from a study of the following specification when viewed in the light of the accompanying drawings, in which:

FIG. 7-1 shows the representation of the numbers in the radix "9" by means of a cyclic code chain 4;

FIGS. 7-2a, 7-2b and 7-2c show the correct bit states of codes B1, B2 and B3, shown in FIG. 7-1;

FIG. 8-1 shows the representation of numerals in the radix "35" by means of a cyclic code chain 11;

FIGS. 8-2a, 8-2b, 8-2c and 8-2d show details of bit states of codes C1 to C4, shown in FIG. 8-1;

FIG. 9-1 shows a positional code system wherein two unit-distance codes are used to represent a decimal number;

FIG. 9-2 is a diagram of a logic circuit for converting the codes derived from the code system shown in FIG. 9-1 into a binary-coded decimal;

FIG. 9-3 show a sync bit code system, this sync bit code system being advantageous when a maximum relative displacement is a random number so that the unit-distance relationship cannot be attained between "0" and the maximum relative displacement or position "359";

FIG. 9-4 is a diagram of a logic circuit used in conjunction with the sync bit code system shown in FIG. 9-3;

DETAILED DESCRIPTION

How to establish the code system in accordance with the present invention will now be described.

First, types of binary coded base-n codes (where $n \geq 2$) must be determined for representing the relative position or displacement between two bodies. Next, first, second, third, ..., and m-th unit distance code groups which are selected from the types are determined, where "m" is preferably the least submultiple or aliquot part of "n" except "1", in order to represent the base-n numbers "0", "1", "2", ..., and "n-1". The binary numeral in the first code representing the base-n number "0" must be the same with the binary numeral in the m-th code representing the base-n number "n-1", and the binary numeral in the first code representing the base-n number "n-1" must be the same with the binary numeral in the next or second code representing the base-n number "0". The same is true for between the second and third codes, between the third and fourth codes, ..., and between the m-1-th and m-th codes. In the cases of radix two and ten, the cyclic code patterns have been well developed. That is, the well known Gray code is so applicable to the cyclic code pattern of radix $n=2$ as Spaulding teaching code is to be pattern of radix ten. The present invention concerns with the other radixes or the relationship of codes between the maximum and minimum numbers. At least three types of codes are necessary for representing numbers which distinguish the present invention from the prior art.

Figure 6:
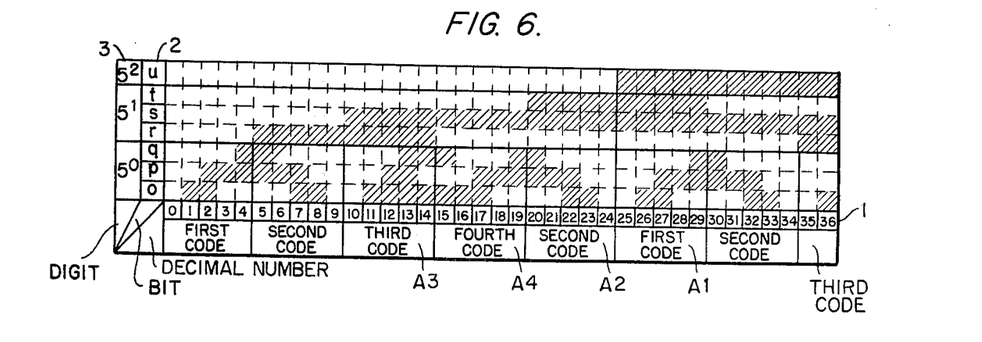
FIG. 6 shows an example of code patterns used for representing odd-number radix "5"

Referring to FIG. 6 decimal numbers are converted into numerals in the radix "5" by the use of a cyclic code chain consisting of five groups of codes selected from four types of codes A1, A2, A3 and A4. Decimal numbers are indicated in the row 1 while the column 2 indicates bits o-u and the column 3, weights $5^0$, $5^1$ and $5^2$.

Since the submultiple of "5" is "5", one cycle consists of five groups of codes. As will be described in more detail with reference to FIG. 8, of the five groups of codes, four groups are different from each other.

Figure 71:
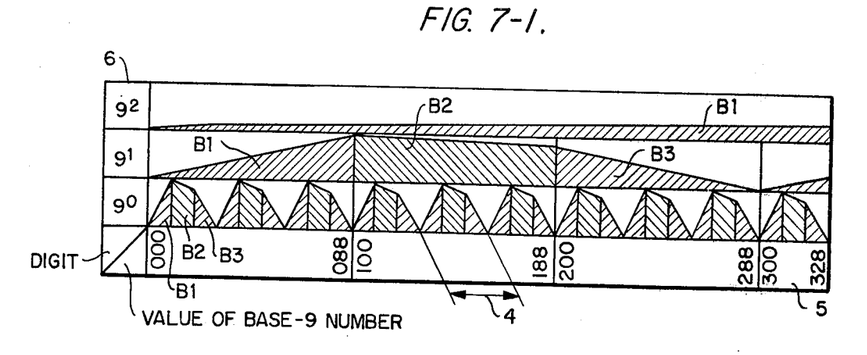

FIG. 7-1 shows the representation of the numbers in the radix "9" by means of a cyclic code chain 4 consisting of three types of codes B1, B2 and B3. Arabic indications of base-9 number are indicated in the row 5, while the column 6 indicates weight $9^0$, $9^1$ and $9^2$.

For the sake of simplicity, the bit states are represented by hatched areas in FIG. 7-1 but FIGS. 7-2a, 7-2b and 7-2c show the correct bit states of codes B1, B2 and B3, respectively. The row 7 indicates number "0"–"8", and the column 8 indicates bits v-y.

Each type consists of nine characters, and the successive or adjacent characters are different only in one place. It should be noted that the last character "8" in the first type B1 (see FIG. 7-2a) is the same in the bit state with the first character "0" in the second type B2 (see FIG. 7-2b). The last character "8" in the second type B2 is the same in the bit state with the first character "0" in the third type B3 (see FIG. 7-2c) and the last character "8" in the third type B3 is the same with the first character "0" in the first type B1.

The submultiples of "9" are "3" and "9". It is preferable to use three codes in one cycle, thereby simplifying the decoding circuits.

Figure 81:
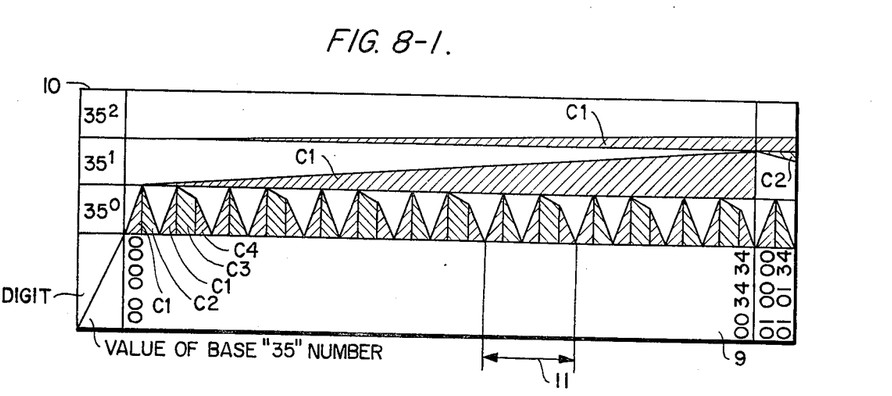

FIG. 8-1 shows the representation of numerals in the radix "35" by means of a cycle code chain 11 consisting of five groups of codes selected from first, second, and third and fourth types of codes C1–C4. Arabic indications of base-35 number are shown in the row 9, while column 10 indicates weight $35^0$, $35^1$ and $35^2$.

The details of bit states of these codes C1–C4 are shown in FIGS. 8-2a, 8-2b, 8-2c, and 8-2d, respectively, where the row 12 indicates number "0"–"34" and the column 13 indicates bits z-el. Each type consists of 35 characters and the successive or adjacent characters in each type are different only in one place. It should be noted again that the last character "34" in the first type C1 (see FIG. 8-2a) is the same in the bit state with the first character "0" in the second type C2 (see FIG. 8-2b). In like manner, the last character "34" in the third type C3 (see 8-2c) is the same with the first character "0" in the fourth type C4 (see FIG. 8-2c) and the last characters "34" in the C2 and C4 are the same with the first character "0" in the C1. These formula may be generalized as follows: the last character in one group is the same in the bit state with the first character of an adjacent group.

The submultiples of "35" are "5", "7" and "35". It is also preferable to use five codes in one cycle so as to simplify the decoding circuits.

The methods for forming cyclic chains 11 of codes with m=5 will be described in detail below. First, the first and second types of codes C1 and C2 are alternately arranged so as to form a chain consisting of four groups of codes. Next remove one of the codes (for instance C2) thus arranged, and instead insert a chain consisting of the third and the fourth codes C3 and C4. Then the chain has five codes, thus forming a cyclic code chain.

The similar procedures may be applied in the case of m=3. That is, first the first and second codes are alternately arranged so as to form a chain consisting of (m-1) groups. Next remove one of the codes thus arranged and instead insert a chain consisting of one third code and one fourth code. The the total number of codes in the chain becomes m. However, it should be noted that no suitable codes are available when n=3.

When n=9 or over and is a multiple of "3", a cyclic code chain with m=3 may be provided from three different types of codes in a manner substantially similar to that described above with particular reference to FIG. 7-1. It is apparent that a cyclic code chain with m codes may be provided from three-or-over and m-or-below different groups of codes. In case of an odd number with n=5, a cyclic code may be provided by selecting a number of m types of codes from at least four different types of codes as described above in conjunction with FIGS. 6 and 8-1. It is apparent that a cyclic code with m codes may be provided from four-or-over and m-or-below different types of codes. However, it is to be emphasized here that the reduction in number of the types of codes used merely results in the simplification of the decoding circuits and is not the object of the present invention at all.

Figure 92:
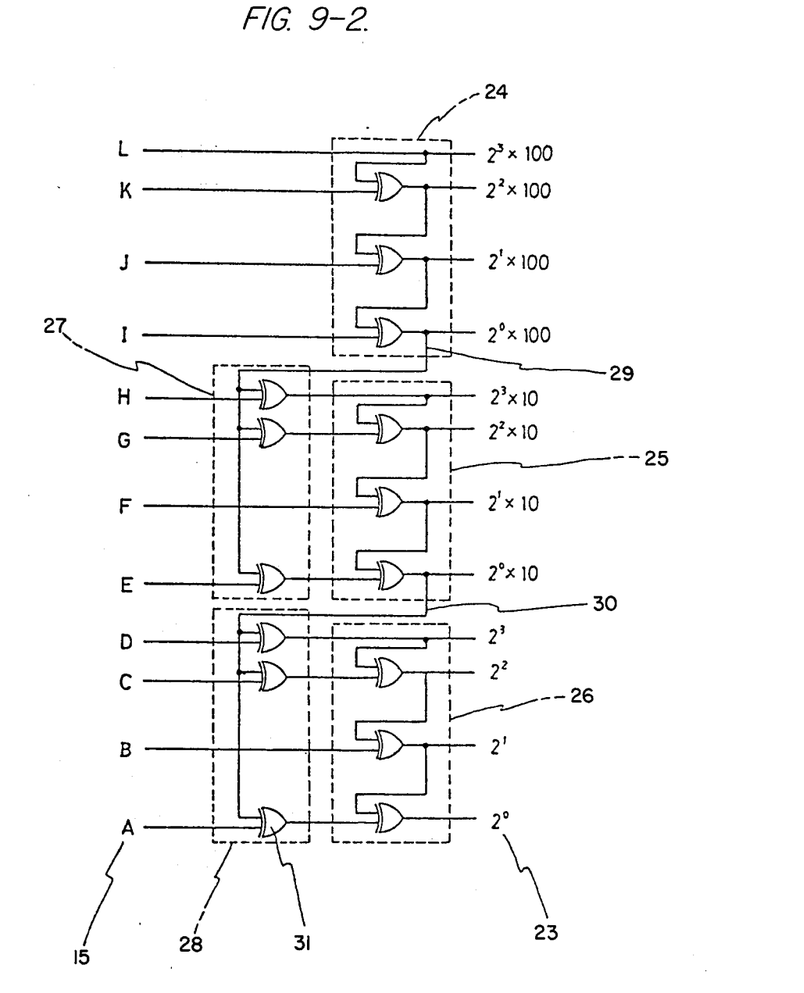

In order to convert m codes in a chain into one common binary code, the character in the next higher digit is discriminated to convert the transmission characteristic of each of the digits (see FIG. 9-2 of the present application, lines 29 and 30).

Figure 91:
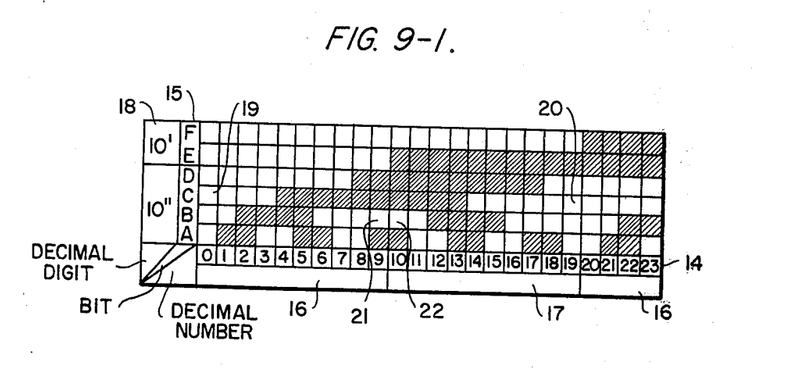

In FIG. 9-1, the base is "10", and the relative position or displacement between two bodies are represented by the binary coded decimal. Submultiples or aliquot parts of "10" are "1", "2", "5" and "10", and the least submultiple of aliquot part except "1" is "2". Thus "m" is "2" and first 16 and second 17 codes of a chain are determined for representing the decimal number from "0" to "9". Arabic indications of decimal number "0"–"23" are shown in the row 14, the column 15 indicates bits A-F and the column 18 indicates the weight $10^0$, $10^1$. Within the weight $10^0$ in the column 18, the binary numeral 19 in the first code representing the decimal number "0" is the same with the binary numeral 20 representing "19" in the second code 17, and the binary number "9" (21) in the first code 16 is the same with the binary numeral "10" (22) in the second code 17. The binary numerals consisting of six bits A, B, C, D, E and F therefore represent the decimal numbers from "0" to "23". Both the first and second codes 16 and 17 are four-bit unit-distance codes.

The circuit shown in FIG. 9-2 is used to convert the decimal numbers from "0" to "999" into the binary coded decimal. The bits 15 A through L (G through L being not shown in FIG. 9-1) are applied to their corresponding inputs 15 and the decimal digits at outputs 23 are weighed. Each of logic circuits 24, 25 and 26 converts the first code 16 into the common binary number representing each decimal digit of a number, and logic circuits 27 and 28 transmit the first and second codes 16 and 17 into the first code 16. A discriminating signal is transmitted through a line 29 to the logic circuit 27 in order to control it depending upon whether the decimal digit at the digit of hundreds is odd or even. In like manner, a discriminating signal is transmitted through a line 30 to the unit-digit logic circuit 28 in order to control it depending upon whether the decimal digit at the digit of tens is odd or even. The symbol of a gate 31 represents an EXCLUSIVE-OR gate.

Figure 93:
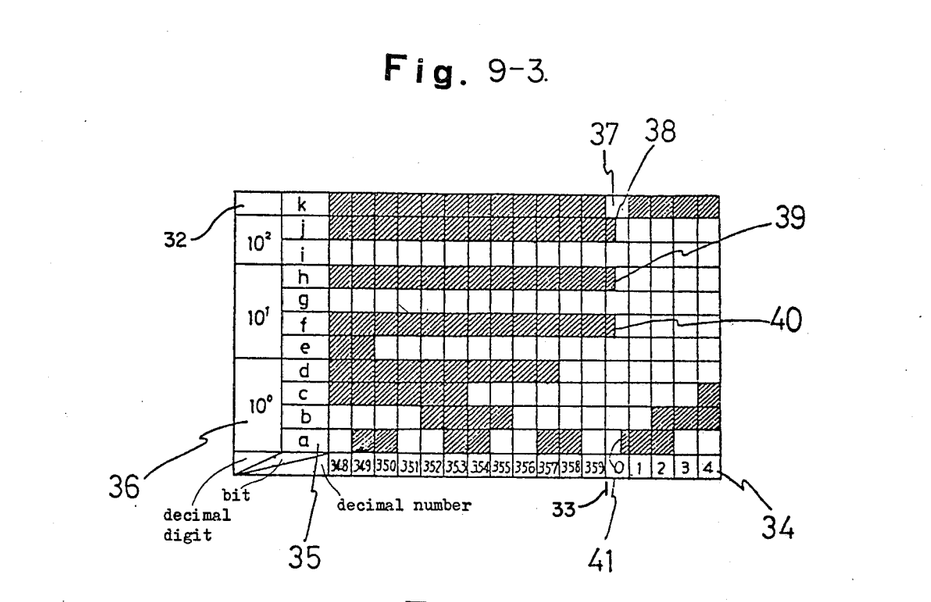

In FIG. 9-3 there is shown a sync bit code system adapted to the cyclic counting from the decimal number "0" to a decimal number having several bits in the state of "1". That is, this sync bit code 32 may solve the discontinuity problem of transient 33 between the decimal number "0" and the maximum decimal number having bits in state of "1". With the code shown in FIG. 9-3 the cyclic counting is made from the decimal number "0" to the decimal number "359". The decimal numbers are plotted along the abscissa 34 while the bits a through j of binary numerals, along the column 35. The bits 35 a through j are the same with the bits 15 in FIG. 9-1 except the state at the decimal number "0", where the decimal number is defined by the sync bit code 32 instead of the first and second codes 16 and 17.

The decimal digits at the least significant digit or the digit of units and at the next least significant digit or the digit of tens are represented by four-bit binary numerals while the decimal digit at the most significant digit or digit of hundreds is represented by a two-bit binary numeral. The sync bit code 32 changes to "0" or a low level 37 only and only when the decimal number is "0", and remains in the "1" state when the ten-bit binary numeral 35 represents a decimal number except "0". When the maximum decimal number "359" changes to "0", bits in the places j 38, h 39 and f 40 change from "1" to "0".

Figure 94:
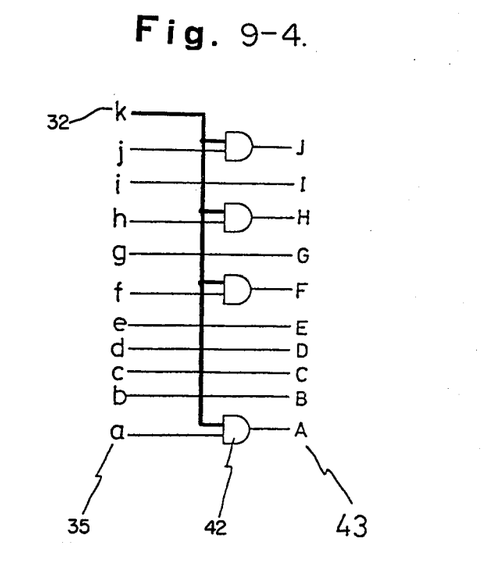

In FIG. 9-4 there is shown a circuit used in conjunction with the code system shown in FIG. 9-3. Transition timing of the bits j 38, h 39, f 40 and a 41 all of which are associated with the low level 37 of the sync bit code 32 is delayed as shown in FIG. 9-3 so that the correct synchronization may be attained. The symbol of a gate 42 represents an AND gate.

In FIG. 9-2 and FIG. 9-4, digital circuits are demonstrated, but the converting function of these circuits can be attained by a matrix gate or by a computer. For example, a discriminating signal line 29 corresponds to conditional transfer, and the relation of input 15 and output 23 corresponds to that of addressing and reading out of a memory in a computer.

Figure 10:
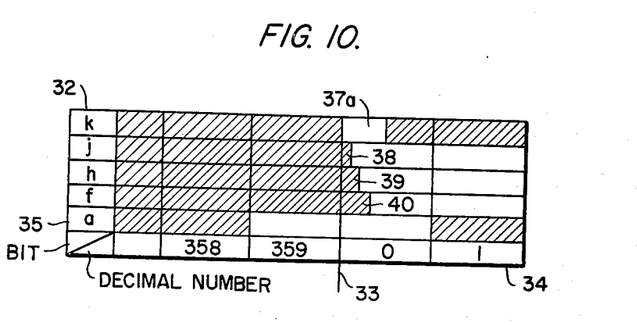
FIG. 10 and FIG. 11 are other types of sync bit code systems which are applicable to FIG. 9-3 modification.
Figure 11:
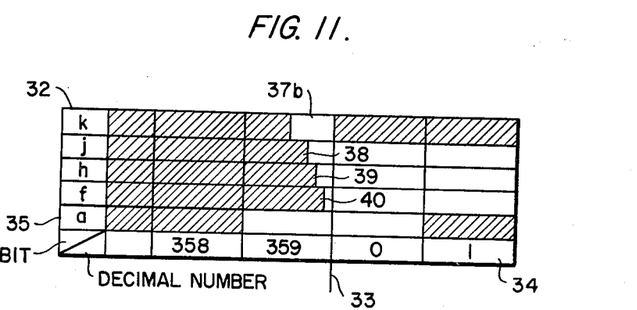

FIGS. 10 and 11 are used for the further detailed explanation of the sync bit code 32 shown in FIG. 9.

In FIG. 9-3 of the present application, the low level 37 (a white square) is inserted in "0" over the whole length thereof, but in FIGS. 10 and 11, the low levels 37a and 37b are partly inserted in "0" and "359". Furthermore it should be noted that the leading edge of the low level 37a in FIG. 10 coincides with the trailing edge 32 of the code "359". In like manner, the trailing edge of the low level 37b shown in FIG. 11 coincides with the leading edge 32 of the code "0". In practice, however, there exists physical boundaries between "359" and "0" as far as the low level 37a or 37b is concerned, and the transition 32 from "359" to "0" may be detected in terms of the occurrence of the low level 37a or the termination of the low level 37b.

The sync bit code 32 is generated in order to prevent the ambiguous reading. Therefore it is generated independently of other codes. In the illustrative examples shown in FIG. 9-3 and FIG. 10, the detection of the low level 37 or 37a means the detection of "0". In like manner, in FIG. 11 the detection of the low level 37b means the detection of the word "359".

In this connection, it must be emphasized that during the presence of the low level 37, 37a or 37b, the bits 35 change the state from "359" to "0" or from "0" to "359". Furthermore during the absence of the low level 37, 37a or 37b no ambiguous bit patterns occur.

Next referring to FIGS. 12, 13 and 14, three preferred embodiments of encoders in accordance with the present invention will be described. As will be described in detail below, all are of the type wherein the light beams transmitted through a coding mask or scale or reflected from the coding mask or scale is intercepted by optical sensors. In the embodiments shown in FIGS. 12 and 13, the light beams are transmitted through the coding mask or scale while in the embodiment shown in FIG. 14 the light beams are reflected from the coding mask or scale. In the embodiment shown in FIG. 12 the code pattern is plotted in a polar coordinates system.

Figure 12:
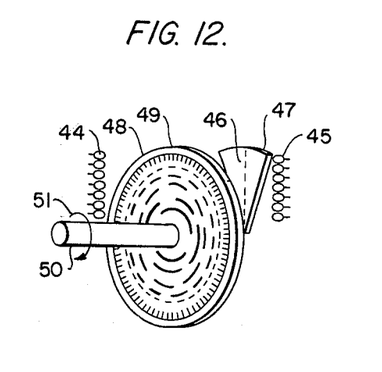
FIGS. 12, 13 and 14 are schematic view of first, second and third embodiments of an optical type encoder in accordance with the present invention.

Referring to FIG. 12, interposed between an array of light sources 44 and an array of optical sensors 45 are a shielding mask 47 formed with a plurality of slits 46 and a coding disk 49 made of a glass plate and formed with a light beam shielding coding pattern of a unit-distance code described in detail hereinbefore. When the coding pattern 48 overlaps the slits 46 of the shielding mask 47 the light beams from the light source array 44 are interrupted so that the code pattern overlapping the slits 46 may be read out by the optical sensor array 45. That is, upon rotation of the shaft 50 in the direction indicated by the arrow 51, the binary numerals of a unit-distance code may be read out.

Figure 13:
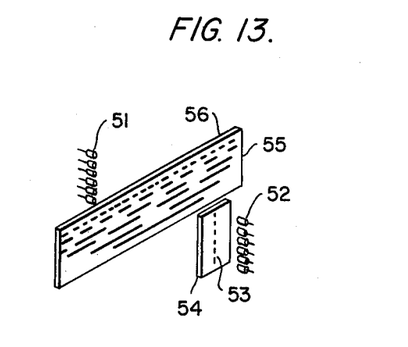

In the embodiment shown in FIG. 13 interposed between a light source array 51 and an optical sensor array or bank 52 are a shielding mask 54 formed with an array of slits 53 and a coding mask 56 made of a glass plate and formed with a coding pattern 55 of a unit-distance code of the type described in detail above. When the coding pattern overlaps the slits 53, the light beams from the light source array 51 are interrupted so that the optical sensor array 52 may read out the code pattern 55 overlapping the slits 53. When the coding mask 56 is displaced from the left to the right or from the right to the left, the binary numerals in a unit-distance code may be read out.

Figure 14:
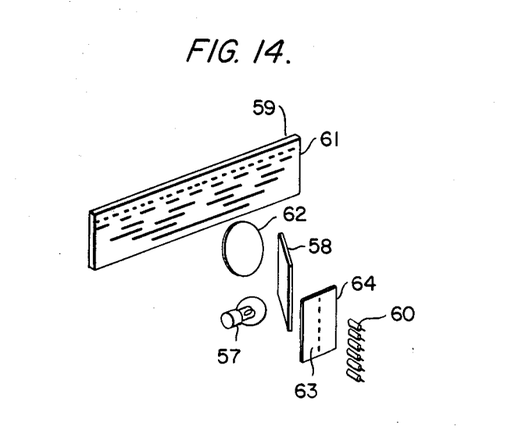

In the embodiment shown in FIG. 14 the light from a light source 57 is redirected by a half mirror 58 toward a coding mask 59 made of a light reflecting metal plate and formed with a code pattern 61 with a non-reflecting material. The light reflected back form the coding mask 59 is focused by a projection lens 62 at the vicinity of slits 63 of a shielding mask 64 so that an optical sensor array 60 may detect the code pattern 61. When the coding mask 59 is displaced from the left to the right or from the right to the left, the binary numerals of a unit-distance code may be derived.

It will be understood that the application of the present invention is not limited to the absolute type encoders described above with reference to FIGS. 12, 13 and 14 and that the present invention may be applied to a wide variety of fields. For instance, the unit-distance code of the present invention may be recorded on the address recording track of a magnetic tape, and the transport of this magnetic recording tape may be stopped when a magnetic head reads out a predetermined code or binary numeral. Thus the information or data stored on the specified address on the magnetic recording tape may be automatically read out. So far the present invention has been described in conjunction with the code systems for generating the binary coded decimal, but it is to be understood that the present invention may be equally applied to a code for generating a binary-coded base-n number.

In summary, according to the present invention a code pattern is formed on one side surface of one of two movable bodies in the direction of movement, and a reader is mounted on the other body for reading the code pattern on said one body so that the relative position or displacement between the two bodies may be measured. A complete unit-distance code with a signal distance of "1" is marked on said one body so that the erroneous outputs may be avoided and consequently reliability may be considerably increased. Since the erroneous outputs may be avoided, the width of the transparent or opaque areas of the code pattern may be reduced so that the accuracy in measurement may be remarkably improved.

Furthermore, opposed to the prior art devices which do not use a complete unit-distance code with a signal distance of "1", the device in accordance with the present invention uses the sync bit in order to avoid erroneous outputs. As a result, the device in accordance with the present invention is simple in construction and inexpensive to manufacture yet highly reliable and dependable in operation.

Even when the outputs from the encoder incorporating the present invention are transmitted in parallel and even when the output pulses are such that their transition time is not so clear, the erroneous outputs may be minimized because a unit-distance code in accordance with the present invention is used.

In case of serial-transmission, the transmission error may be easily detected by the comparison between the preceding and succeeding pulses.

When the device in accordance with the present invention is incorporated into the encoder as described above with reference to FIGS. 12, 13 and 14, the encoder may be connected to any computers which are extremely reliable and dependable in operation and which may accept the inputs of any codes, without the use of a complex code converter. Furthermore, as described above, when the code in accordance with the present invention is recorded on a data recording medium such as a magnetic recording tape, an automatic addressing device may be feasible.

What is claimed is:

1. In an apparatus for detecting the relative position or displacement between two movable bodies of the type wherein a code pattern representing the relative position or displacement between said two movable bodies is marked on one of said two movable bodies in the direction of movement or displacement, and a reading means is mounted on the other movable body for reading said code pattern on said one movable body, the improvement
   (a) wherein said code pattern on said one movable body represents numeric words of base-n number (where n≧2), the characters corresponding to each order of base-n number being represented by binary numerals;
   (b) wherein said characters comprise elements of each one code of "m" codes in one cycle, (where "m" is an aliquot part or submultiple of "n") one or more of said cycles being arranged in a chain or in a link corresponding to the respective order of base-n number except the highest order represented by another code, all of said codes being characterized in that the characters representative of successive numbers in each code are arranged to differ in only one binary number;
   (c) wherein between the consecutive codes in each order of base-n numbers, the state of binary numerals representing the character "n-1" in the preceding code is the same with the state of binary numerals representing the character "0" in the succeeding code; and
   (d) wherein when "n" is an even number, "m" is two, and two kinds of codes are included in said one cycle, wherein when "n" is a multiple of three, "m" is three and three kinds of codes are included in said one cycle, and wherein when "n" is "5" or a further odd number, at least four kinds of codes are included in said one cycle;
   (e) and further wherein said reading means includes a code converter circuit for converting said code pattern representing the base-n number into a suitable binary code, said code converter circuit including a transmitting circuit at the least significant digit, and a convertor circuit including both a transmitting circuit and a character discriminating circuit for outputting a discriminating signal at each of the remaining digits, at least one code being inputted into the transmitting circuit and the character discriminating circuit at the highest order, at the least significant digit three or more kinds of codes as well as the discriminating signal from a respective preceding digit being inputted into the transmitting circuit, while at each of the remaining digits three or more kinds of codes as well as the discriminating signal from a respective preceding digit are inputted into the transmitting circuit and the character discriminating circuit, respectively, whereby the relative position or displacement between said two movable bodies may be represented by said binary coded base-n number.

2. Apparatus as defined in claim 1, wherein said code pattern has a sync bit code, the codes for the "maximum number" and the "minimum number" being adjacent each other, said sync bit being operable only in such adjacent region with a width, all of contact points between the bits representing said "maximum number" and said "minimum number" are inside of said width excluding boundary rise and fall points of the sync bit; the signal of the sync bit being a code corresponding to said "maximum number" and said "minimum number", respectively, said code being inputted into the transmitting circuit at each of the digits preceding the other inputs.

* * * * *